(12) United States Patent
Jun

(10) Patent No.: US 11,395,427 B2
(45) Date of Patent: Jul. 19, 2022

(54) CONTROL PANEL FOR PREVENTING WATER ACCUMULATION AND OUTDOOR DEVICE

(71) Applicant: SMA Solar Technology AG, Niestetal (DE)

(72) Inventor: He Jun, Suzhou (CN)

(73) Assignee: SMA Solar Technology AG, Niestetal (DE)

( * ) Notice: Subject to any disclaimer, the term of this patent is extended or adjusted under 35 U.S.C. 154(b) by 63 days.

(21) Appl. No.: 16/791,175

(22) Filed: Feb. 14, 2020

(65) Prior Publication Data

US 2020/0187376 A1   Jun. 11, 2020

Related U.S. Application Data

(63) Continuation of application No. PCT/EP2018/071954, filed on Aug. 13, 2018.

(30) Foreign Application Priority Data

Aug. 15, 2017   (CN) .......................... 201721015113.4

(51) Int. Cl.
*H05K 5/06* (2006.01)
*H05K 5/02* (2006.01)

(52) U.S. Cl.
CPC ........... *H05K 5/069* (2013.01); *H05K 5/0217* (2013.01)

(58) Field of Classification Search
CPC .... H05K 5/069; H05K 5/0217; G07F 7/1033; G07F 9/023; G06F 2203/04809; G06F 1/1656; G06F 1/182; G06F 1/1637

See application file for complete search history.

(56) References Cited

U.S. PATENT DOCUMENTS 5,421,659 A * 6/1995 Liang ......................... B41J 5/10
                                                                200/306
5,613,223 A * 3/1997 Ross ...................... G06F 1/1626
                                                                455/575.1
5,681,122 A * 10/1997 Burke ................... G06F 3/0202
                                                                200/302.2

(Continued)

*Primary Examiner* — Anthony M Haughton
*Assistant Examiner* — Theron S Milliser
(74) *Attorney, Agent, or Firm* — Eschweiler & Potashnik, LLC

(57) ABSTRACT

The disclosure discloses a control panel and an outdoor device with the control panel, which can discharge accumulated water in the control panel to prevent water accumulation. A control panel for preventing water accumulation includes a display sheet which is transparent or translucent and used for covering and protecting a circuit board and/or component, an interface label having functional areas allowing a user to observe or operate the circuit board and/or component, and an adhesive layer connected between areas of the display sheet and the interface label except for the functional areas so as to adhere the display sheet and the interface label together. Cavities are formed between the functional areas of the interface label and corresponding locations of the display sheet so as to form a display window and/or key windows. The water guiding grooves are provided in the adhesive layer for communicating the cavities with the outside so as to discharge the accumulated water.

16 Claims, 2 Drawing Sheets

(56) References Cited

U.S. PATENT DOCUMENTS

| | | | | |
|---|---|---|---|---|
| 5,721,666 | A * | 2/1998 | Girard | B29C 70/78 |
| | | | | 361/627 |
| 5,734,136 | A * | 3/1998 | Newcomer | H01H 13/702 |
| | | | | 200/302.1 |
| 6,443,644 | B1 * | 9/2002 | Takeda | G06F 3/0202 |
| | | | | 200/302.1 |
| 6,467,683 | B2 * | 10/2002 | Jun | H01H 13/70 |
| | | | | 235/145 R |
| 6,573,463 | B2 * | 6/2003 | Ono | B29C 45/1418 |
| | | | | 200/302.2 |
| 6,644,874 | B2 * | 11/2003 | Tsai | G06F 1/1616 |
| | | | | 200/302.1 |
| 6,750,407 | B2 * | 6/2004 | Song | B29C 45/1418 |
| | | | | 200/5 A |
| 7,038,598 | B2 * | 5/2006 | Uke | G06F 3/0202 |
| | | | | 200/302.1 |
| 7,230,195 | B2 * | 6/2007 | Ohnishi | H01H 9/18 |
| | | | | 200/302.1 |
| 7,365,281 | B2 * | 4/2008 | Yamaguchi | G06F 3/0202 |
| | | | | 200/302.1 |
| 7,920,225 | B2 * | 4/2011 | Nishikawa | G06F 1/169 |
| | | | | 349/60 |
| 8,081,445 | B2 * | 12/2011 | Nakatani | G06F 1/1616 |
| | | | | 361/679.55 |
| 8,158,899 | B2 * | 4/2012 | Bloch | H01H 13/06 |
| | | | | 200/302.2 |
| 8,199,491 | B2 * | 6/2012 | Uchiyama | H01H 13/86 |
| | | | | 361/679.55 |
| 8,233,290 | B2 * | 7/2012 | Choi | H05K 5/069 |
| | | | | 361/812 |
| 8,263,886 | B2 * | 9/2012 | Lin | H01H 13/86 |
| | | | | 200/302.2 |
| 8,410,383 | B2 * | 4/2013 | Clark | H01H 9/181 |
| | | | | 200/330 |
| 8,469,264 | B1 | 6/2013 | Almeida | |
| 8,514,581 | B2 * | 8/2013 | Hasegawa | H05K 3/0064 |
| | | | | 361/749 |
| 8,824,162 | B2 * | 9/2014 | Alvarez | H05K 7/1427 |
| | | | | 361/765 |
| 9,585,275 | B2 * | 2/2017 | Alvarez | H05K 5/0213 |
| 9,716,934 | B2 * | 7/2017 | Qian | H04R 1/086 |
| 9,839,152 | B2 * | 12/2017 | La Paglia | H01H 13/705 |
| 2002/0063149 | A1 * | 5/2002 | Jun | H01H 13/70 |
| | | | | 235/145 R |
| 2003/0129010 | A1 * | 7/2003 | Tsai | G06F 1/1662 |
| | | | | 400/472 |
| 2003/0150699 | A1 * | 8/2003 | Song | B29C 45/1418 |
| | | | | 200/5 A |
| 2003/0222800 | A1 * | 12/2003 | Uke | G06F 3/0202 |
| | | | | 341/22 |
| 2006/0225995 | A1 * | 10/2006 | Ohnishi | H01H 13/86 |
| | | | | 200/302.1 |
| 2007/0074473 | A1 * | 4/2007 | Yamaguchi | H04M 1/23 |
| | | | | 52/302.1 |
| 2009/0154133 | A1 * | 6/2009 | Choi | H05K 5/069 |
| | | | | 361/812 |
| 2010/0053854 | A1 * | 3/2010 | Nishikawa | G06F 3/045 |
| | | | | 361/679.01 |
| 2011/0061928 | A1 * | 3/2011 | Hasegawa | H05K 3/0064 |
| | | | | 174/535 |
| 2012/0012204 | A1 * | 1/2012 | Uchiyama | H01H 13/86 |
| | | | | 137/561 R |
| 2012/0051007 | A1 * | 3/2012 | Alvarez | H05K 3/284 |
| | | | | 361/752 |
| 2013/0343026 | A1 * | 12/2013 | La Paglia | H01H 13/86 |
| | | | | 361/809 |
| 2014/0369012 | A1 * | 12/2014 | Alvarez | H05K 5/069 |
| | | | | 361/757 |

* cited by examiner

CONTROL PANEL FOR PREVENTING WATER ACCUMULATION AND OUTDOOR DEVICE

CROSS REFERENCE TO RELATED APPLICATIONS

This application is a continuation of International Patent Application number PCT/EP2018/057513, filed on Mar. 23, 2018, which claims priority to German Patent Application number 10 2017 113 192.2, filed on Jun. 14, 2017, and is hereby incorporated by reference in its entirety.

FIELD

This application relates to the field of daily use products, in particular to a control panel and an outdoor device with the control panel.

BACKGROUND

The display circuit board of a human-computer interaction display interface of an outdoor device is generally designed with an LCD screen, an LED indicator and touch sensitive keys. A control panel is covered on the display circuit board to facilitate a user to check the status of the device or operate the device as needed. These three components of the display circuit board are all installed in a housing of the device. The control panel generally includes a transparent display sheet made of PC material. The transparent display sheet is provided with sealant so as to seal the display circuit board from the outside atmosphere. Generally, an interface label will be bonded to the transparent display sheet made of PC material, so as to plan the three components as a whole through a graphic design pattern. Conventionally, when designing an interface label, in order to facilitate checking and keep the sensitivity of the key, no double-sided tape will be adhered to the areas of the LCD screen, the LED indicator and the touch sensitive key. Therefore, there will be a gap of 0.1-0.3 mm (i.e., the thickness of adhesive) between the substrate material of the label and the transparent display sheet made of PC material in these three areas. Since the adhesive of double-sided tape is not dense enough, rainwater will permeate through the adhesive and accumulate in the above three areas (i.e., the areas without adhesive) between the interface label and the transparent display sheet after long-term outdoor use, which will affect the user's experience (e.g. the display window is obscured by water, and the sensitivity of touch sensitive keys is greatly reduced), making the user feel like the water has entered into the device housing. Besides, being soaked in the water for a long time will also reduce the viscosity of the adhesive of the interface label, and cause the interface label to crack and greatly shorten the service life thereof. In a traditional solution, a double-sided tape with a denser structure is used for the label, and the adhering area of the double-sided tape is increased to prevent rainwater from permeating, but this will cause the overall cost of the control panel to rise and the reliability is not high.

SUMMARY

In order to solve the problem that in the traditional control panel rainwater can easily permeate the adhesive of the interface label and accumulate in the control panel during long-term outdoor use, the disclosure provides a control panel and an outdoor device with the control panel, which can discharge accumulated water in the control panel to prevent water accumulation.

In order to achieve the above goal, the technical scheme adopted by the disclosure is as follows:

A control panel for preventing water accumulation is disclosed and comprises a display sheet which is transparent or translucent and used for covering and protecting a circuit board and/or component. The control panel also comprises an interface label having functional areas allowing a user to observe or operate the circuit board and/or component, and an adhesive layer connected between areas of the display sheet and the interface label except for the functional areas so as to adhere the display sheet and the interface label together. Cavities are formed between the functional areas of the interface label and corresponding locations of the display sheet so as to form a display window and/or key windows. Water guiding grooves are provided in the adhesive layer for communicating the cavities with the outside so as to discharge the accumulated water. In one embodiment, the control panel is adapted to an interface label made of PET or PC material which is screen printed and requires a secondary adhesive, and adapted to be used on a housing of outdoor device as a control panel of a human-computer interaction interface display window. The control panel can discharge water penetrated into the adhesive of the interface label timely and quickly, eliminating the adverse effects of the accumulated water on the adhesive property, preventing failure of touch sensitive keys, and preventing the display window from being obscured due to immersion in water.

In one embodiment, the water guiding grooves are communicating with the lowest parts of the cavities.

In one embodiment, the plane in which the display sheet is located and the plane in which the interface label is located form an angle greater than 0 degrees with respect to a horizontal plane, respectively, and the water guiding grooves are arranged below the cavities and communicate with the lower ends of the cavities.

In one embodiment, the center line of the water guiding groove is a straight line. The water guiding groove is strip-shaped and formed by a die cutting process in one embodiment.

Further, the length of the water guiding groove is equal to the shortest distance from the lower end of the cavity to the outside.

In one embodiment, the cavities include an upper cavity and a lower cavity which are spaced apart in an up-down direction. The lower end of the upper cavity and the upper end of the lower cavity are communicating with each other through a first water guiding groove therebetween, and the lower end of the lower cavity is communicating with the outside through a second water guiding groove.

In one embodiment, each cavity is communicating with the outside through one or more water guiding grooves.

In one embodiment, the functional areas of the interface label include one or more of a display screen area for allowing the display screen to be observed, an indicator area for allowing light to pass through, and a key area for marking a key.

In one embodiment, the display sheet and the interface label are arranged in parallel and spaced apart by 0.1 to 0.3 mm. The functional areas are marked on the interface label by screen printing. The material of the interface label is PET or PC, and the display sheet is a transparent PC sheet.

Another technical scheme adopted by the disclosure is as follows:

An outdoor device, comprising a housing in which a window is arranged, and a circuit board and/or component for displaying the status of the outdoor device or for operating the outdoor device is arranged in the window. The outdoor device further comprises the control panel being fixedly arranged on the housing and covering the circuit board and/or component so as to close the window. The housing may comprise a box body formed by sheet metal forming or die casting. The protection rating of the housing is IP65. The control panel is connected to the housing of the outdoor device through sealant and is installed outdoors together with the device, subjecting it to outdoor weather conditions such as sunshine and rain.

This disclosure adopts the above schemes and has the following advantages compared with the prior art:

A part of adhesive on the adhesive layer is cut off to form water guiding grooves, i.e. the water guiding groove areas do not have adhesive, and thus the water penetrated into the adhesive and accumulated in the cavities at the functional areas for forming the display window and/or the key area can be discharged in time. Due to the water guiding grooves, the adhesive will not immerge in water for a long time which otherwise may reduce its viscosity, the sensitivity of touch sensitive keys and the like will not decrease due to water accumulation, and the display window will not be obscured by accumulated water which otherwise may cause the display window difficult to read, or even make the user feel like that water has entered into the device housing. The water guiding groove is simple to manufacture, reliable in performance and low in price. Therefore, the control panel has the advantages of easy processing, highly reliable and cost effective.

BRIEF DESCRIPTION OF DRAWINGS

In order to more clearly explain the technical schemes of the present disclosure, the drawings will be briefly described below which are useful in description of the embodiments. Obviously, the drawings in the following description are only some embodiments of the disclosure. For one ordinary skilled in the art, other drawings can be conceived based on these drawings.

DETAILED DESCRIPTION

One embodiment of the disclosure will be described in detail below with reference to the attached drawings, so that the advantages and features of the disclosure can be more easily understood by those skilled in the art. It will be understood that the description of these embodiments is used to help understand this disclosure, and does not constitute a limitation on this disclosure. In addition, the technical features referred to in the various embodiments of the disclosure described below can be combined with each other as long as they do not constitute conflicts with each other.

Figure 1:
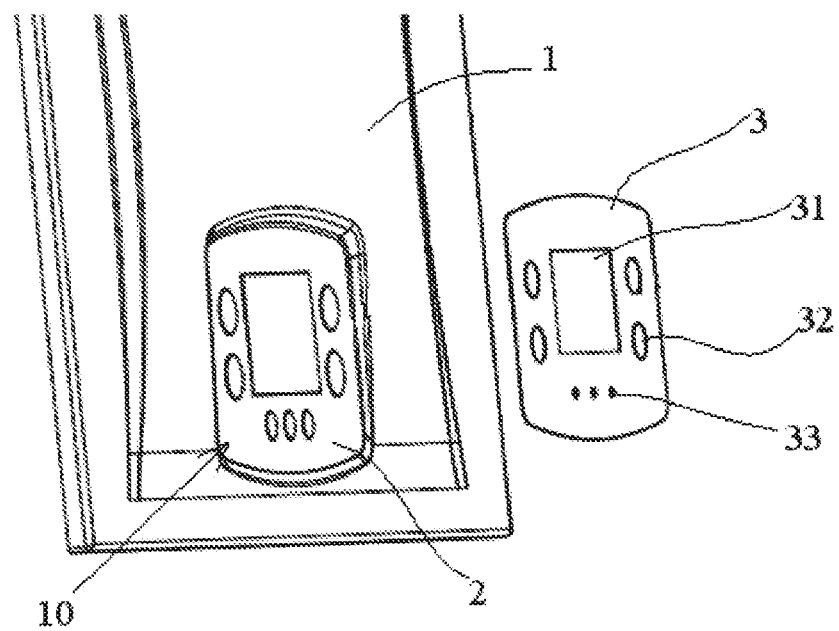
FIG. 1 is a schematic view of a housing and a control panel detached of an outdoor device according to the disclosure.
Figure 2:
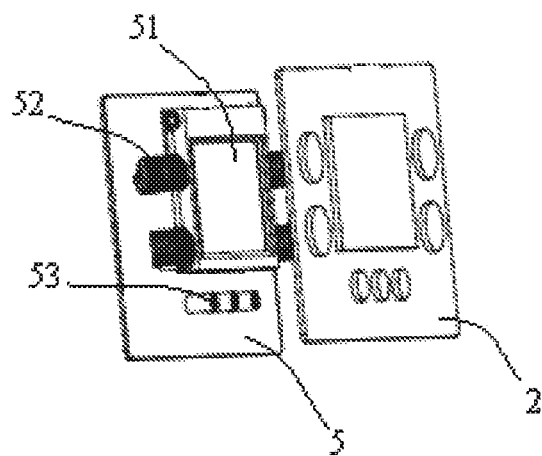
FIG. 2 is a schematic view of a display circuit board and a display sheet which are detached from each other.

The position terms upper, lower and the like mentioned in this disclosure are defined according to the usual perspective of observation of those skilled in the art and for ease of description, and will not be limited to a specific direction. For example, upper and lower correspond respectively to the upper side and the lower side of the page in FIG. 1.

An embodiment provides an outdoor device, in particular a control panel suitable for the outdoor device and for preventing water accumulation. Referring to FIGS. 1-4, the outdoor device includes a housing 1 which is a box body formed by sheet metal forming or die casting. The housing 1 is provided with a window 10 in which a circuit board and/or component for displaying the state of the outdoor device and for operating the outdoor device is arranged. In this embodiment, the circuit board is specifically a display circuit board 5. The control panel is fixedly arranged on the housing 1, and is used for sealing and covering the display circuit board 5, in order to protect the same. The protection rating of the housing 1 is IP65. The control panel is connected to the housing 1 of outdoor device through sealant and is installed outdoors together with the device, subjecting to outdoor weather conditions such as sunshine and rain.

The control panel for preventing water accumulation specifically includes a display sheet 2, an interface label 3 and an adhesive layer 4 which is connected between the display sheet 2 and the interface label 3 to adhere these two together. The display sheet 2 is transparent or translucent, and in one embodiment made of transparent PC (polycarbonate) material. The display sheet is arranged on the wall of the housing 1 by a sealant, and seals the window, thus protecting the display circuit board 5 from water in the outside atmosphere. The interface label 3 is marked and formed with one or more functional areas through screen printing, and the functional areas allow the user to observe or operate the circuit board and/or component. The material of the interface label 3 is PET (polyethylene terephthalate) or PC. The adhesive layer 4 consists of double-sided tape only filled between the areas of the display sheet 2 and the interface label 3 expect for the functional areas, so that cavities 40 are formed between the functional areas of the interface label 3 and the corresponding areas of the display sheet 2. That is to say, the cavities 40 are a display window, key windows, and indicator windows. The adhesive layer 4 is provided with water guiding grooves 41 for communicating the cavities 40 with the outside so as to drain the accumulated water.

As for the outdoor device of this embodiment, the display circuit board 5 specifically includes an LCD screen 51, four touch sensitive keys 52, and three LEDs 53, which is convenient for the user to check the status of the device or operate the device as needed. Correspondingly, the functional areas on the interface label 3 include a display screen area 31, four key areas 32, and three indicator areas 33. There is no adhesive between the portions of the display sheet 2 and the interface label 3 corresponding to these areas. Therefore, the numbers, shapes, sizes and positions of cavities 40 on the adhesive layer 4 are the same as or correspond to those of functional areas. Thus, the user can observe the information displayed on the LCD screen 51 through the display screen area 31, the cavity 40 corresponding to the display screen area 31, and the display sheet 2. The touch sensitive keys 52 can be operated by pressing the key areas 32, the cavities 40 corresponding to the key areas 32, and the display sheet 2, so as to change the status of the outdoor device. The status of each LED 53 can be observed through the indicator area 33, the cavity 40 corresponding to the indicator area 33, and the display sheet 2, and in combination with the status tags printed on the interface label 3, the current status of the outdoor device can be obtained.

The control panel is, in one embodiment, arranged non-horizontally, i.e. vertically or obliquely. That is to say, the plane where the display sheet 2 is located and the plane where the interface label 3 is located form an angle greater than 0 degrees with respect to the horizontal plane, respectively. The water guiding groove 41 is arranged below the cavity 40 and is communicating with the lower end of the cavity 40. The water guiding groove 41 is, in one embodiment, communicating with the lowest part of the cavity 40 so that under the effect of gravity, the accumulated water in the cavity 40 can flow into the water guiding groove 41. The center line of the water guiding groove 41 is a straight line so that the water flows along the shortest path and is discharged quickly in the direction of the straight line. The water guiding groove 41 is, in one embodiment, strip-shaped and formed by a die cutting process. The length of the water guiding groove 41 is equal to the shortest distance from the lower end of the cavity 40 to the outside. In this embodiment, a special arrangement mode is provided in which the control panel is vertically arranged on the housing 1 and hence the center line of the water guiding groove 41 also extends in the vertical direction, that is, the outlet of the water guiding groove 41 is located directly below the inlet thereof, so that the water flow path is the shortest path.

Figure 3:
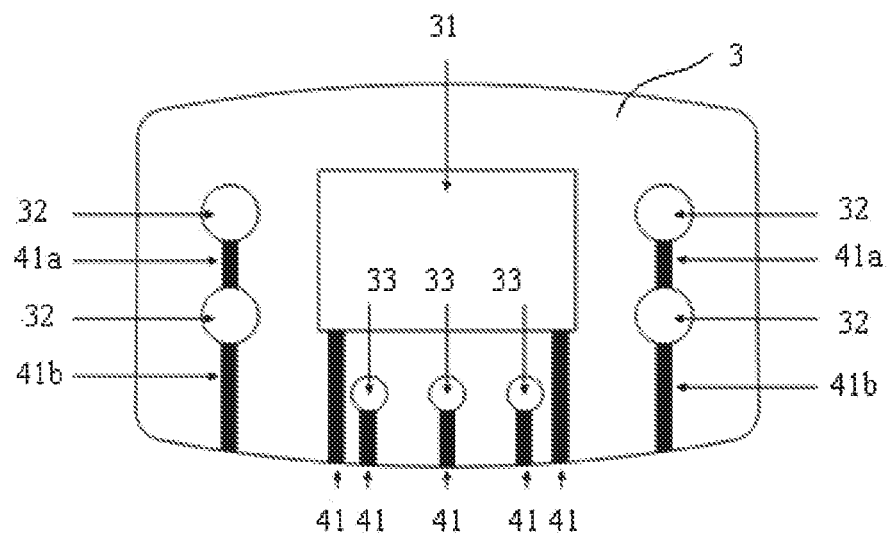
FIG. 3 is a front perspective view of the control panel.
Figure 4:
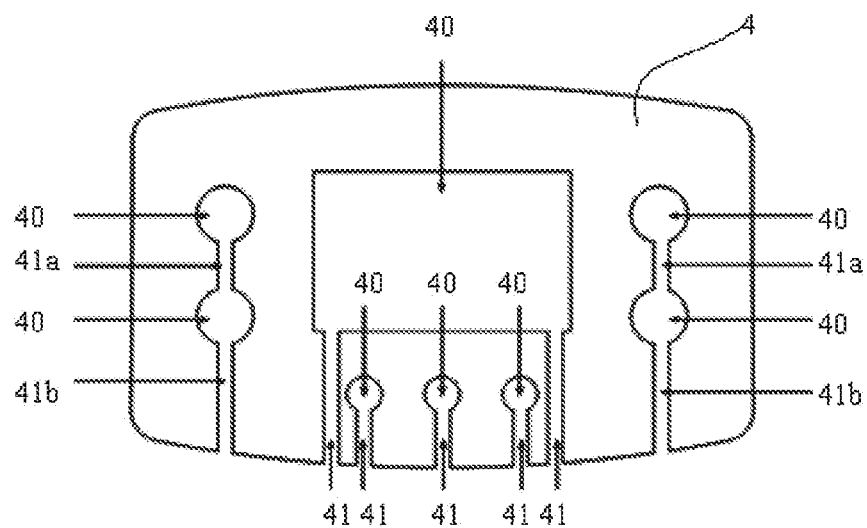
FIG. 4 is a schematic front view of the adhesive layer.

As shown in FIGS. 3 and 4, as for the cavity 40 corresponding to the display screen area 31, the left and right sides of the lower end of this cavity are directly communicating with the outside through water guiding grooves 41. As for the cavities 40 corresponding to the indicator areas 33, each cavity 40 is communicating with the outside through a water guiding groove 41. As for the upper and lower cavities 40 which are spaced apart in an up-down direction and correspond to the two key areas 32 on the same side, the lower end of the upper cavity 40 and the upper end of the lower cavity 40 are communicating with each other through a first water guiding groove 41a therebetween, and the lower end of the lower cavity 40 is communicating with the outside through a second water guiding groove 41b. The areas corresponding to the LCD screen 51, the touch sensitive keys 52 and the LEDs 53, and the water guiding grooves 41 are free of adhesive, and all these adhesive-free areas are in communication with the outside atmosphere, thus ensuring that all these adhesive-free areas will not form a closed structure after the interface label 3 is pasted.

The display sheet 2 and the interface label 3 are arranged in parallel and spaced apart by 0.1 to 0.3 mm, that is, the thickness of the adhesive layer 4 is 0.1 to 0.3 mm, and hence the thickness of each cavity 40 is 0.1 to 0.3 mm.

The control panel is adapted to be used on the housing 1 of the outdoor device as a control panel of a human-computer interaction interface display window. Such control panel can rapidly and timely discharge accumulated water infiltrated into the adhesive of the interface label 3, eliminating the adverse effects of the accumulated water on the adhesive property, preventing failure of touch sensitive keys, and preventing the display window from being obscured due to immersion in water.

The embodiments described above are merely for illustrating the technical concept and characteristics of this disclosure. These embodiments are embodiments which do not limit the protection scope of this applicant, and the purpose thereof is to enable those skilled in the art to understand the contents of this disclosure and implement it accordingly. Any equivalent transformation or modification made according to the spirit of the disclosure shall fall in the protection scope of the disclosure.

The invention claimed is:

1. A control panel for preventing water accumulation, comprising:
a display sheet which is transparent or translucent and configured to cover and protect a circuit board,
an interface label having functional areas that allow a user to observe or operate the circuit board, and
an adhesive layer connected between areas of the display sheet and the interface label except for the functional areas so as to adhere the display sheet and the interface label together,
wherein a first cavity and a second cavity reside between the functional areas of the interface label and corresponding locations of the display sheet so as to form a display window and a key window, respectively, wherein the adhesive layer separates the first cavity from the second cavity, and
wherein a first water guiding groove resides in the adhesive layer and is configured to establish fluid communication between the first cavity and an outside environment external to the control panel so as to discharge accumulated water from the first cavity, and wherein a second water guiding groove resides in the adhesive layer and is configured to establish fluid communication between the second cavity and the outside environment so as to discharge accumulated water from the second cavity.

2. The control panel according to claim 1, wherein the first and second water guiding grooves are configured to fluidly communicate with a vertically lowest part or parts of the first and second cavities, respectively, so that accumulated water in the first and second cavities flows into the first and second water guiding grooves, respectively, under the influence of gravity.

3. The control panel according to claim 1, wherein a plane in which the display sheet is located and a plane in which the interface label is located form an angle greater than 0 degrees with respect to a horizontal plane, respectively, and the first and second water guiding grooves are arranged vertically below the first and second cavities, respectively, and are in fluid communication with the first and second cavities, respectively, so that accumulated water in the first and second cavities flows into the first and second water guiding grooves, respectively, under the influence of gravity.

4. The control panel according to claim 3, wherein center lines of the first and second water guiding grooves are straight lines.

5. The control panel according to claim 4, wherein a length of the first water guiding groove is equal to the shortest distance from a lower end of the first cavity to a point outside the control panel.

6. The control panel according to claim 3, wherein a third cavity resides between the functional areas of the interface label and corresponding locations of the display sheet, wherein the adhesive layer separates the third cavity from the first cavity, wherein the second and third cavities are spaced apart vertically with respect to one another, wherein a lower end of the third cavity and an upper end of the second cavity are in fluid communication with each other through a third water guiding groove therebetween, and a lower end of the second cavity is in fluid communication with the outside environment through the second water guiding groove.

7. The control panel according to claim 1, wherein the functional areas of the interface label comprise one or more of a display screen area configured to allow a display screen to be observed, an indicator area configured to allow light to pass through, and a key area configured to mark a key.

8. The control panel according to claim 1, wherein the display sheet and the interface label are arranged in parallel with one another and are spaced apart from one another by 0.1 to 0.3 mm, wherein the functional areas are marked on the interface label by screen printing, and wherein material of the interface label is polyethylene terephthalate (PET) or polycarbonate (PC), and the display sheet is a transparent PC sheet.

9. An outdoor device, comprising a housing in which a window is arranged, and a circuit board for displaying a status of the outdoor device or for operating the outdoor device being arranged in the window, wherein the outdoor device further comprises a control panel for preventing water accumulation, the control panel comprising:
- a display sheet which is transparent or translucent and configured to cover and protect the circuit board,
- an interface label having functional areas that allow a user to observe or operate the circuit board, and
- an adhesive layer connected between areas of the display sheet and the interface label except for the functional areas so as to adhere the display sheet and the interface label together,
- wherein a first cavity, a second cavity, and a third cavity reside between the functional areas of the interface label and corresponding locations of the display sheet, wherein the adhesive layer separates the first cavity from both the second cavity and the third cavity,
- wherein a first water guiding groove resides in the adhesive layer and is configured to establish fluid communication between the first cavity and an outside environment external to the control panel so as to discharge accumulated water from the first cavity, and wherein a second water guiding groove resides in the adhesive layer and is configured to establish fluid communication between the second cavity and the outside environment so as to discharge accumulated water from the second cavity, and
- wherein the second cavity is directly between the third cavity and the outside environment, and wherein a third water guiding groove extends from the third cavity to the second cavity and is configured to establish fluid communication between the third cavity and the second cavity.

10. The outdoor device according to claim 9, wherein the first, second, and third cavities are formed by first gaps in the adhesive layer that extend from the interface label to the display sheet, wherein the first, second, and third water guiding grooves reside between the interface label and the display sheet, wherein the first, second, and third water guiding grooves are formed by second gaps in the adhesive layer that extend from the interface label to the display sheet.

11. The outdoor device according to claim 10, wherein the control panel is devoid of the adhesive layer between the interface label and the display sheet at the first gaps and the second gaps.

12. The control panel according to claim 10, wherein the first, second, and third water guiding grooves are delimited by a boundary of the adhesive layer, a front surface of the display sheet, and a back surface of the interface label.

13. The control panel according to claim 10, wherein the first, second, and third water guiding grooves are cutout sections of the adhesive layer.

14. A control panel for preventing water accumulation, comprising:
- a display sheet configured to cover and protect a circuit board,
- an interface label, and
- an adhesive layer between the display sheet and the interface label,
- wherein a first gap in the adhesive layer extends between a first area of the interface label and a corresponding first area of the display sheet,
- wherein a second gap in the adhesive layer extends between a second area of the interface label and a corresponding second area of the display sheet, wherein the second gap establishes fluid communication between the first gap and an outside environment external to the control panel so as to discharge accumulated water from the first gap,
- wherein a third gap in the adhesive layer extends between a third area of the interface label and a corresponding third area of the display sheet, wherein the third gap is separated from the first gap by the adhesive layer,
- wherein a fourth gap in the adhesive layer extends between a fourth area of the interface label and a corresponding fourth area of the display sheet, wherein the fourth gap establishes fluid communication between the third gap and the outside environment so as to discharge accumulated water from the third gap.

15. The control panel according to claim 14, wherein the adhesive layer does not extend between the first area of the interface label and the first area of the display sheet, and wherein the adhesive layer does not extend between the second area of the interface label and the second area of the display sheet.

16. The control panel according to claim 14, wherein the first gap is delimited by a boundary of the adhesive layer, a front surface of the display sheet, and a back surface of the interface label.

* * * * *